(12) United States Patent
Kireev (10) Patent No.: US 9,832,048 B2
(45) Date of Patent: Nov. 28, 2017

(54) TRANSMITTER CIRCUIT FOR AND METHODS OF GENERATING A MODULATED SIGNAL IN A TRANSMITTER

(71) Applicant: Xilinx, Inc., San Jose, CA (US)

(72) Inventor: Vassili Kireev, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/834,276

(22) Filed: Aug. 24, 2015

(65) Prior Publication Data
US 2017/0063580 A1    Mar. 2, 2017

(51) Int. Cl.
| H04L 25/08 | (2006.01) |
| H04L 25/06 | (2006.01) |
| H04L 25/49 | (2006.01) |
| H04L 27/04 | (2006.01) |
| H03K 19/0185 | (2006.01) |

(52) U.S. Cl.
CPC ... H04L 25/085 (2013.01); H03K 19/018528 (2013.01); H04L 25/06 (2013.01); H04L 25/4917 (2013.01); H04L 27/04 (2013.01)

(58) Field of Classification Search
CPC ... H04L 25/085; H04L 25/4917; H04L 27/04; H04L 25/06; H03K 7/02; H03K 19/017527; H03K 17/296; H03K 19/1737
See application file for complete search history.

(56) References Cited

U.S. PATENT DOCUMENTS

| 5,298,810 A | 3/1994 | Scott et al. |
| 5,428,303 A | 6/1995 | Pasqualini |
| 5,485,110 A * | 1/1996 | Jones ............... H03K 3/287 326/126 |
| 5,754,059 A * | 5/1998 | Tanghe ............ H03K 19/01812 326/63 |
| 6,137,340 A * | 10/2000 | Goodell ............ H03K 17/6257 327/403 |
| 6,262,606 B1* | 7/2001 | Tamjidi ............. H03K 17/693 327/108 |

(Continued)

FOREIGN PATENT DOCUMENTS

| EP | 0980143 | 2/2000 |
| WO | 2013009418 | 1/2013 |

OTHER PUBLICATIONS

Fei Yuan "CMOS Current-Mode Circuits for Data Communication", Chapter 5, 2007 pp. 95-136.*

(Continued)

*Primary Examiner* — Sophia Vlahos
(74) *Attorney, Agent, or Firm* — John J. King; Robert M. Brush (57) ABSTRACT

A transmitter circuit for generating a modulated signal in a transmitter of an integrated circuit is described. The transmitter circuit comprises a multiplexing stage having a multiplexing circuit configured to receive a differential input signal and to generate a differential output signal at a first output node of a first current path and at a second output node of a second current path, the multiplexing stage having a gain circuit configured to increase the swing of the differential output signal generated at the first output node and the second output node. A method of generating a modulated signal in a transmitter of an integrated circuit is also disclosed.

17 Claims, 6 Drawing Sheets

(56) References Cited

U.S. PATENT DOCUMENTS

| | | | | |
|---|---|---|---|---|
| 6,310,379 B1* | 10/2001 | Andresen | ............ | H01L 27/0277 |
| | | | | 257/355 |
| 6,518,816 B2* | 2/2003 | Riccio | .............. | H03K 3/356113 |
| | | | | 326/68 |
| 6,803,788 B2* | 10/2004 | Amick | ................. | G11C 7/1066 |
| | | | | 326/68 |
| 6,809,562 B2* | 10/2004 | Wada | ...................... | H03M 9/00 |
| | | | | 327/113 |
| 7,830,282 B2* | 11/2010 | Lee | ......................... | H03M 9/00 |
| | | | | 341/100 |
| 8,415,980 B2* | 4/2013 | Fiedler | ........... | H03K 19/018521 |
| | | | | 326/83 |
| 8,487,662 B2* | 7/2013 | Kao | ................ | H03K 17/04163 |
| | | | | 327/403 |
| 9,425,192 B2* | 8/2016 | Rahim | ................ | H01L 27/0805 |
| 2002/0097627 A1* | 7/2002 | Sacco | .................... | G11C 5/147 |
| | | | | 365/226 |
| 2013/0154712 A1* | 6/2013 | Hess | .............. | H03K 19/018521 |
| | | | | 327/333 |
| 2014/0159797 A1* | 6/2014 | Kase | .................... | H03K 17/693 |
| | | | | 327/427 |

OTHER PUBLICATIONS

Fei Yuan et al., "A Pseudo-nmos Fully Differential CMOS Current-Mode Multiplexing Transmitter for 10 GB/S Serial Links", IEEE 2004, pp. 1-77-1-80.*

Menolfi, C. et al., A 25Gb/s PAM4 Transmitter in 90nm CMOS SOI, ISSCC 2005, Session 3, Backplane Transceivers, 3.7, 2005 IEEE International Solid-State Circuits Conference, 2 pages, Feb. 23, 2015.

Upadhyaya, P. et al., A 0.5-to-32.75Gb/s Flexible-Reach Wireline Transceiver in 20nm CMOS, ISSCC 2015, Session 3/ Untra-High Speed Wireline Transceivers and Energy-Efficient Links/3.3, 2005 IEEE International Solid-State Circuits Conference, 3 pages.

* cited by examiner

TRANSMITTER CIRCUIT FOR AND METHODS OF GENERATING A MODULATED SIGNAL IN A TRANSMITTER

FIELD OF THE INVENTION

The present invention relates generally to integrated circuit devices, and in particular, to circuits for and methods of generating a modulated signal in an integrated circuit device.

BACKGROUND OF THE INVENTION

Data transmission speed and quality is an important aspect of data communication systems and networks. Data may be transmitted according to different data transmission protocols. Multilevel signal modulation, such as 4 level pulse-amplitude modulation (PAM4), is used for enhancing the data rate in bandwidth limited data communication channels. Integrated circuits enabling data transmission are an important part of the data communication systems and networks. As operating and design characteristics, such as transistor sizes and operating voltages, of integrated circuits continue to change, the performance of a transmitter circuit can be affected.

In gigabit transceiver (GT) with a data rate above 20 gigabits per second (Gb/s), the last multiplexing cell in a transmitter serializer is commonly coupled to a pre-driver stage which drives an output driver stage, such as current mode logic (CML) driver stage. The pre-driver stage should provide approximately 1V of output swing, suppress clock switch ripples to the level less than 50 mV, and have a rise/fall time of approximately 10 ps-15 ps. However, it is difficult to meet all of these requirements together in a CML stage alone because of lack of gain as well as bandwidth limitations.

Accordingly, circuits and methods of providing an improved transmitter circuit of an integrated circuit are desired.

SUMMARY OF THE INVENTION

A transmitter circuit for generating a modulated signal in a transmitter of an integrated circuit is described. The transmitter circuit comprises a multiplexing stage having a multiplexing circuit configured to receive a differential input signal and to generate a differential output signal at a first output node of a first current path and at a second output node of a second current path, the multiplexing stage having a gain circuit configured to increase the swing of the differential output signal generated at the first output node and the second output node.

A method of generating a modulated signal in a transmitter of an integrated circuit is also described. The method comprises coupling a differential input signal to a multiplexing stage having a multiplexing circuit comprising a first current path having a first output node and a second current path having a second output node; implementing a gain circuit in the multiplexing stage to increase the swing of a differential output signal generated at the first output node of the first current path and the second output node of the second current path; and generating the differential output signal at the first output node of the first current path and at the second output node of a second current path.

Other features will be recognized from consideration of the Detailed Description and the Claims, which follow.

DETAILED DESCRIPTION

The circuits and methods provide a multiplexer having high output swing, improved suppression of clock switching noise, having improved performance, low power and high bandwidth. The last stage of transmitter serializer is also referred to as a 2:1 multiplexer (MUX) slicing 2 times for NRZ data or a 4:2 multiplexer slicing 4 times for PAM4 data by a corresponding clock. The multiplexer can be used to drive an output driver, such as a CML driver, directly without an additional pre-driver. According to various implementations, an integrated gain stage of the multiplexer is provided. For example, a Pseudo H-cell topology may be implemented with the multiplexer to provide the necessary gain for an output driver stage.

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

Figure 1:
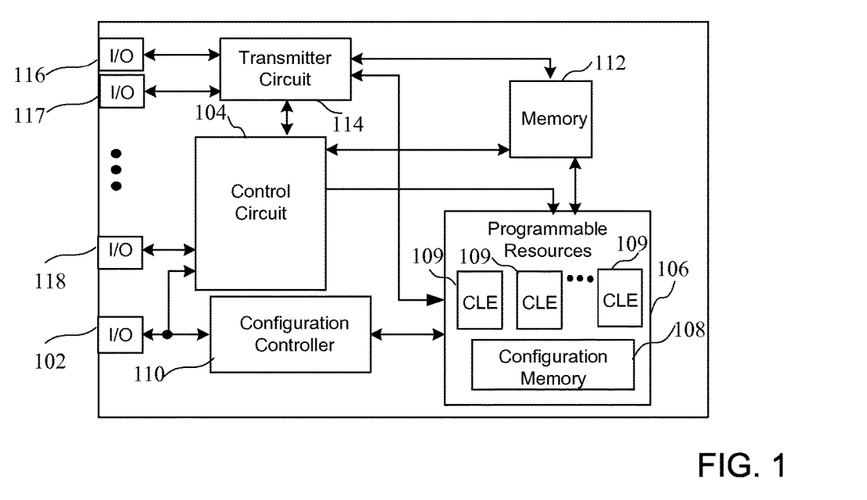
FIG. 1 is a block diagram of an integrated circuit device having a transmitter circuit for transmitting data.

Turning first to FIG. 1, a block diagram of an integrated circuit device having a transmitter circuit for transmitting data is shown. In particular, an input/output port 102 is coupled to a control circuit 104 that controls programmable resources 106 having configuration memory 108. Configuration data may be provided to the configuration memory 108 by a configuration controller 110. The configuration data enables the operation of configurable logic elements 109. While a device having programmable resources is shown by way of example, it should be understood that circuits and methods for generating a modulated signal could be implemented in any type of integrated circuit. A memory 112 may be coupled to the control circuit 104 and the programmable resources 106. A transmitter circuit 114 may be coupled to the control circuit 104, programmable resources 106 and the memory 112, and may transmit signals external to the integrated circuit device by way of an I/O port 116. Other I/O ports may be coupled to circuits of the integrated circuit device, such as I/O port 118 that is coupled to the control circuit 104 as shown. The circuits and methods described in more detail below may be implemented by various elements of the circuit of FIG. 1, and particularly in the transmitter circuit 114.

Figure 2:
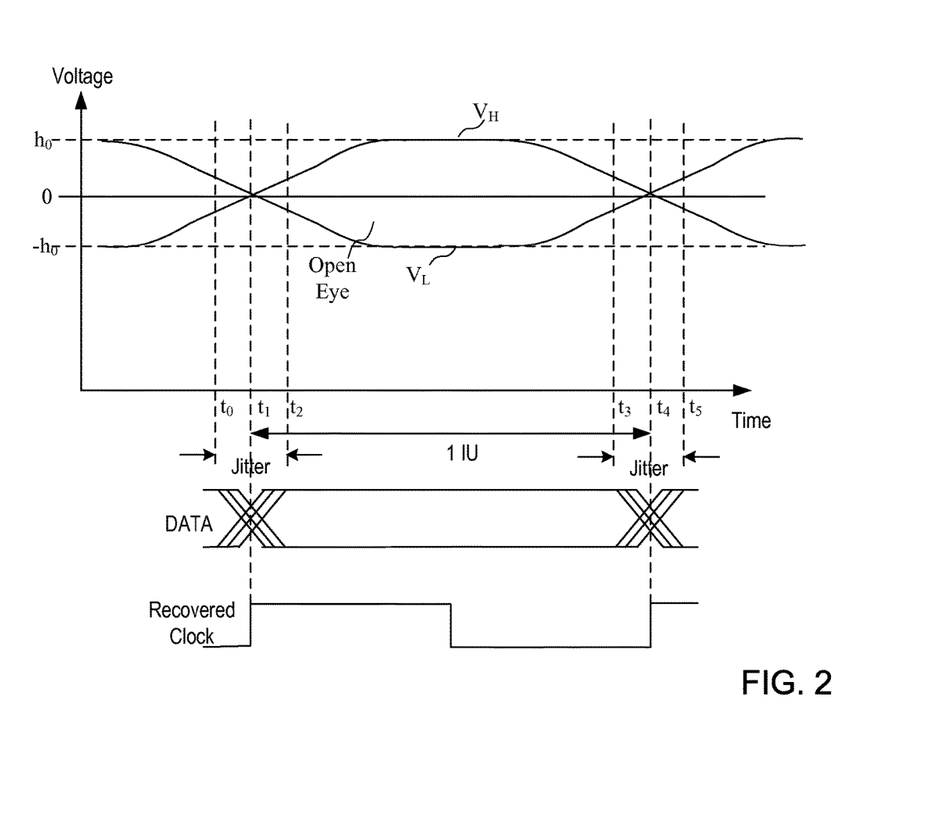
FIG. 2 is an eye diagram showing a non-return to zero (NRZ) pattern associated with data.

Before describing a circuit for transmitting data, it is helpful to describe an eye diagram associated with transmitted data. The eye diagram of FIG. 2 shows a non-return to zero (NRZ) pattern associated with data. While the example of FIG. 2 relates to a non-return-to-zero data signal (i.e. a signal varying symmetrically between a positive voltage and a negative voltage), it should be understood that the circuits and methods set forth below could relate to any type of varying input signal, such as a PAM4 signal as will be described in more detail in reference to FIGS. 6-8. A generated AC signal is typically defined by an "eye pattern," where it is desirable to have a large "open eye" portion so that a detected value at a given time in the middle of the eye pattern (i.e. between jitter on either ends of the eye pattern) can easily be detected as being associated with an expected voltage at the top or bottom of the eye pattern. The received data signal of FIG. 2 represents an NRZ input signal that is symmetrical about zero volts, where the expected value at the top of the eye pattern (i.e. a logical "1") is represented by $h_0$, and the expected value at the bottom of the eye pattern (i.e. a logical "0") is represented by $-h_0$. The beginning of the unit interval (i.e. the period between time $t_1$ and $t_4$) of the received data is at time $t_1$, where jitter may generally be detected between $t_0$ and $t_2$. The data is preferably detected at the center of the eye pattern (shown by the falling edge of the recovered clock signal approximately half way between $t_2$ and $t_3$) where jitter can be expected to be received in another jitter period between $t_3$ and $t_5$. While the eye pattern of FIG. 2 represents an ideal eye pattern, where the voltage level $V_H$ detected at the top of the eye pattern has a positive voltage value of $h_0$, and the voltage level $V_L$ detected at the bottom of the eye pattern has a negative voltage value of $-h_0$, it should be noted that the typical eye pattern for received data over time varies. Therefore, the sharp line representing the eye pattern would be more represented by a much wider pattern representing variations in the detected values over time.

Figure 3:
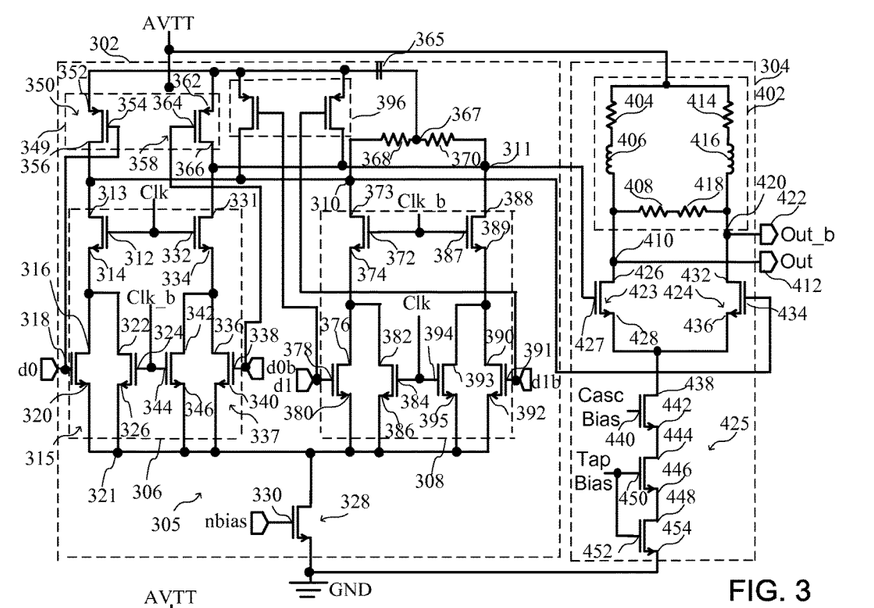
FIG. 3 is a block diagram of a circuit for generating a modulated signal in a transmitter of an integrated circuit for generating NRZ data.

Turning now to FIG. 3, a block diagram of a circuit for generating a modulated signal in a transmitter circuit, such as transmitter circuit 114, of an integrated circuit for generating NRZ data is shown. In particular, the circuit of FIG. 3 comprises a multiplexing stage 302 coupled to receive input data and having outputs coupled to a driver stage 304. The multiplexing stage 302 comprises a plurality of current paths between a reference voltage (AVTT) and a ground voltage (GND). In particular, a multiplexing circuit 305 has a first multiplexer portion 306 comprising a plurality of N-channel transistors coupled to receive first input data d0 and d0b and a second multiplexer portion 308 comprising a plurality of N-channel transistors coupled to receive second input data d1 and d1b. Each of the first multiplexer portion 306 and the second multiplexer portion 308 is coupled to a first node 310 and a second node 311.

The first multiplexer portion 306 comprises a first transistor having a gate 312 coupled to a clock (CLK) signal, a drain 313 coupled to the node 310 and a source 314 coupled to a first pair of transistors coupled in parallel. In particular, the source 314 is coupled to a drain 316 of a first transistor 315 of the pair of transistors. A gate 318 is coupled to receive the input data signal d0, and the source 320 is coupled to a node 321. A drain 322 of the second transistor of the first pair of transistors is coupled to the source 314, where the gate 324 is coupled to the inverted clock signal and the source 326 is coupled to the node 321. A transistor 328 having a drain coupled to node 321 enables node 321 to be coupled to ground. In particular, a bias control signal (nbias) coupled to a gate 330 enables a current path to ground by way of the transistor 328. The nbias signal is a high input signal to keep the transistor 328 on and allow the flow of current by current paths of the multiplexing stages that are turned on.

The first multiplexer portion 306 also comprises a second transistor having a drain 331 coupled to the node 311, a gate 332 coupled to the clock signal, and a source 334 coupled to a second pair of transistors coupled in parallel. In particular, the source 334 is coupled to a drain 336 of a first transistor 337 of the second pair of transistors. A gate 338 is coupled to receive the inverted input data signal d0b, and the source 340 is coupled to a node 321. A source 342 of the second transistor of the second pair of transistors is coupled to the source 334, where the gate 344 is coupled to the inverted clock signal and the source 346 is coupled to the node 321. Therefore, when the clock signal is high, first data (i.e. differential data d0 and d0b) is provided to the nodes 310 and 311, which may be directly coupled to inputs of the driver stage 304. For example, when d0 is high (and d0b is low), the transistor 315 is turned on, pulling node 310 low. The low d0b signal at the gate 338 turns off transistor 337, causing node 311 to be pulled high. That is, the differential input signals d0 and d0b are generated as outputs of the multiplexing stage 302 on nodes 310 and 311 when the clock signal is high, where transistors 315 and 337 operate as switches for enabling the differential digital input data (d0, d0b) to be generated as differential analog output data (out, out_b). Accordingly, when the first multiplexer portion 306 is enabled by the clock signal, a first current path to node 310 is controlled by transistor 315 and a second current path to node 311 is controlled by transistor 337. When the clock signal is low (and the first multiplexer portion 306 is disabled), the inverted clock signal (CLK_b) is coupled to gates 324 and 344 to turn on the transistors and pull drains 316 and 336 to ground at node 321.

A gain circuit 349, which is integrated with the multiplexing stage 302, is coupled to the first multiplexer portion 306 and comprises a first p-channel transistor 350 having a source coupled to the reference voltage AVTT, a gate 354 coupled to receive the input data signal d0 at the gate 318, and a drain 356 coupled to the drain 313 of a transistor coupled to the first pair of transistors in the first current path 306. The integrated gain stage also comprises a second p-channel transistor 358 having a source 362 coupled to the reference voltage AVTT, a gate 364 coupled to receive the inverted input data signal d0b at the drain 388, and a drain 366 coupled to the source 331 of the transistor coupled to the second pair of transistors in the second current path. A capacitor 365 is coupled between the reference voltage AVTT and a node 367 at a pair of resistors 368 and 370 coupled in parallel to the nodes 310 and 311, where the resistor 368 is coupled to the node 310 and the resistor 370 is coupled to the node 311.

The second multiplexer portion 308 is the same as the first multiplexer portion, but is enabled by the inverted clock signal (Clk_b) and receives the second data (i.e. differential data d1 and d1_b). The second multiplexer portion 308 comprises a first transistor having a gate 372 coupled to the inverted clock signal, a drain 373 coupled to the node 310 and a source 374 coupled to a third pair of transistors coupled in parallel. In particular, the source 374 is coupled to a drain 376 of a first transistor of the third pair of transistors. A gate 378 is coupled to receive the input data signal dl, and the source 380 is coupled to node 321. A drain 382 of the second transistor of the third pair of transistors is coupled to the source 374, where the gate 384 is coupled to the clock signal and the source 386 is coupled to the node 321.

The second current path 306 also comprises a second transistor having a gate 387 coupled to the inverted clock signal, a drain 388 coupled to the node 311 and a source 389 coupled to a fourth pair of transistors coupled in parallel. In particular, the source 389 is coupled to a drain 390 of a first transistor of the fourth pair of transistors. A gate 391 is coupled to receive the inverted input data signal d1*b*, and the source 392 is coupled to a node 321. A drain 393 of the second transistor of the fourth pair of transistors is coupled to the source 389, where the gate 394 is coupled to the clock signal and the source 395 is coupled to the node 321. Because of the configuration of the gain circuit 349 of FIG. 3, a separate gain circuit 396, which is the same as the gain stage 349, is provided for the second multiplexer portion 308. However, a single gain circuit 349 can be used for both the first multiplexer portion 306 and the second multiplexer portion 308 when implanting the Pseudo-H cell with positive feedback, as will be described in more detail below in reference to FIG. 4. Accordingly, the second multiplexer portion 308 enables generating the second input data (d1 and d1*b*) as output data when the inverted clock signal is high. Therefore, the first input data and the second input data are serialized and alternately generated as output data by using the clock and inverted clock signals.

The driver stage 304, shown here as a CML driver, comprises an output portion 402 having a first resistor 404 coupled between the reference voltage (AVTT) and an inductor 406, which is coupled to a resistor 408 at a node 410. The node 410 is coupled to a first output terminal 412. The output portion also comprises a second resistor 414 coupled between the reference voltage and an inductor 416, which is coupled to a resistor 418 at a node 420, where the node 420 is coupled to a second output terminal 422. The resistors 408 and 418 are coupled in series between nodes 410 and 420.

The driver stage 304 further comprises output transistors 423 and 424 coupled to the nodes 410 and 420 at the output terminals and a tail current path 425. A drain 426 of the transistor 423 is coupled to the node 410, a gate 427 is coupled to the node 311, and a source 428 is coupled to the tail current path 425. A drain 432 of the transistor 424 is coupled to the node 420, a gate 434 is coupled to the node 310, and a source 436 is coupled to the tail current path 425. The tail current path 425 comprises a plurality of transistors coupled in series, including a first transistor having a drain 438 coupled to the source 436 of the transistor 424, a gate 440 is coupled to a cascade bias (Casc Bias) signal, and a source 442 coupled to a drain 444 of a second transistor. The second transistor also comprises a source 446 coupled to a drain 448 of a third transistor. A Tap Bias signal is coupled to a gate 450 of the second transistor and a gate 452 of the third transistor. A source 454 of the third transistor is coupled to ground. The cascade bias signal enables current flow in the tail current portion, and the Tap bias is used to control the amount of current in the tail current path, and therefore the output of the driver stage 304. Accordingly, the transistors 350 and 358 of the gain circuit 349 enable a Pseudo H-cell with the transistors 315 and 337, and therefore provides an integrated gain circuit of the multiplexer to provide the necessary gain for the driver stage without using a separate pre-driver stage before the driver stage.

Figure 4:
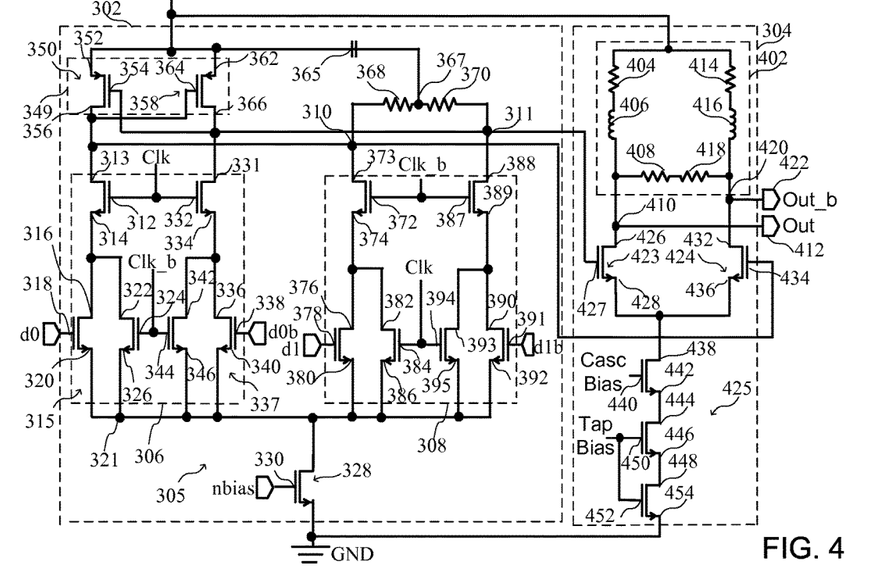
FIG. 4 is another block diagram of a circuit for generating a modulated signal in a transmitter of an integrated circuit for generating NRZ data.

Turning now to FIG. 4, another block diagram of a circuit for generating a modulated signal in a transmitter of an integrated circuit for generating NRZ data is shown. More particularly, the circuit of FIG. 4 provides a gain stage enabling a Pseudo H-cell having positive feedback. According to the implementation of FIG. 4, the transistors 350 and 358 of the integrated gain circuit 349 are configured with cross-coupled gates to implement an Pseudo H-cell using transistors 315 and 337. In particular, the gate 354 of the transistor 350 is coupled to the drain 366 of the transistor 358, and the gate 364 of the transistor 358 is coupled to the drain 356 of the transistor 350. Accordingly, the transistors 350 and 358 of the gain circuit 349 enable a Pseudo H-cell with the transistors 315 and 337, and therefore provides an integrated gain circuit of the multiplexer to provide the necessary gain for the driver stage without using a pre-driver stage before the driver stage. The circuit of FIG. 4 providing a Pseudo H-cell having positive feedback has a sharper gain profile that gives better suppression of the clock switching noise compared to the circuit of FIG. 3 when used for a 2:1 multiplexer. At zero differential inputs, the cross-coupled P-channel transistors have a substantial negative resistance (1/gm) that greatly increase alternately current (ac) gain at the outputs. Therefore lower gain at maximum differential output can be reached for this circuit while the gain at the cross point (zero differential output) is still higher than gain for conventional CML stage. This achieved by optimization of design parameters such as gm and Rout of transistors 350 and 358, the transistors of the first portion of the first multiplexer portion 306 receiving the clock signal, the transistors of the second multiplexer portion 308 receiving the inverted clock signal, and resistors 368,370. With a lower gain at maximum differential output, the switching noise is reduced. More particularly, the total impedance looking from the nodes 310 and 311 is R/(1−gmR), where R is the resistance of resistors 368 and 370, gm is the transconductance of the cross-coupled transistors 350 and 358, and Gm is negative because the transistors are cross coupled. That is, the impedance is the parallel combination of R and 1/gm, where gm achieves a nominal value at zero cross (i.e. when potentials at both side is the same). When the differential voltage is non-zero, gm is small and diminishes when voltage achieves its differential maximum (or minimum). This load enables achieving high gain at zero cross, and low gain at maximum (minimum) differential voltage to help to suppress clock switch noise.

Figure 5:
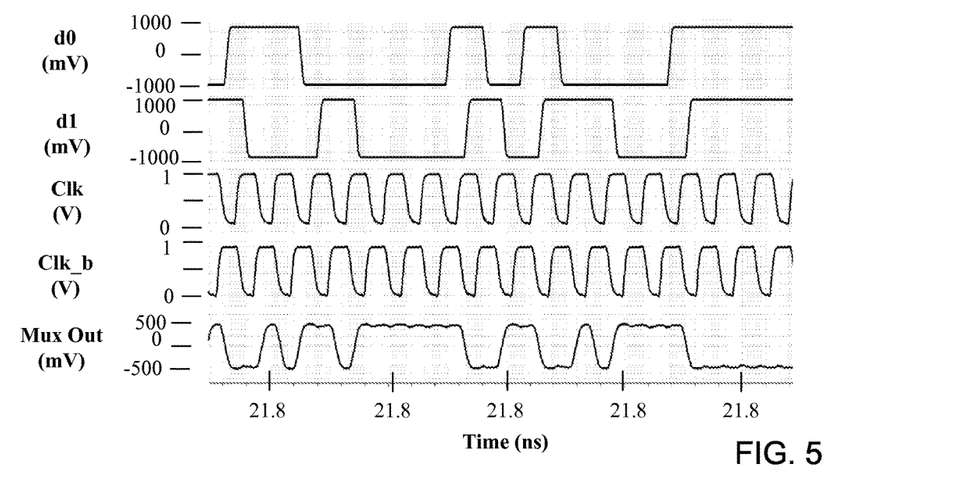
FIG. 5 is a timing diagram showing the operation of the circuit of FIG. 4.

The timing diagram of FIG. 5 shows the operation of the circuit of FIG. 4. The output signal at the differential output of the multiplexer at nodes 310 and 311 (Mux Out) for the input data Data0 and Data1 is shown for the Clk and Clkb signals. As shown in FIG. 5, the Mux Out voltage swing across the nodes 310 and 311 is approximately 1 V for Clk and Clk_b signals of approximately 1 V. It should be noted that the voltage swing across the nodes 310 and 311 is approximately twice the voltage swing of the circuit without the gain circuit 349.

Figure 6:
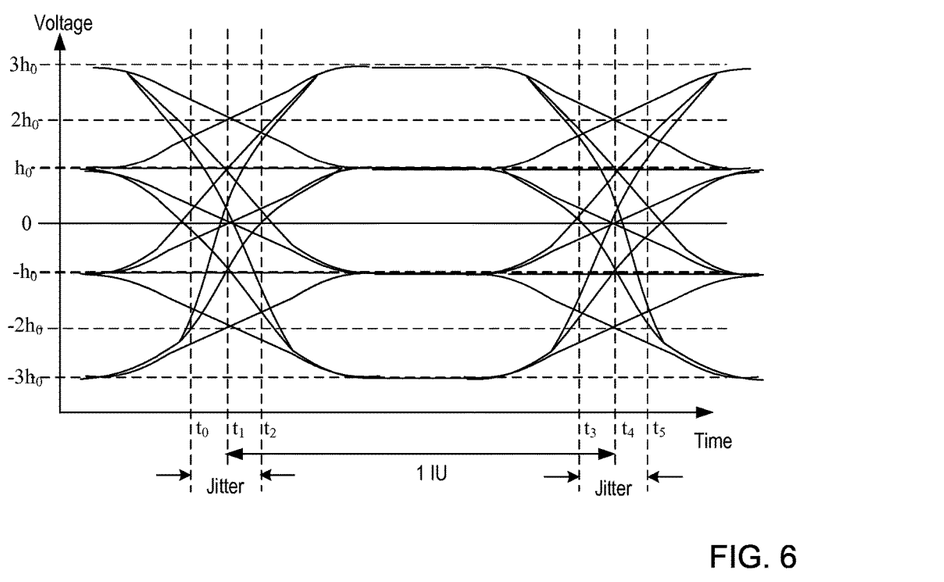
FIG. 6 is an eye diagram showing a PAM4 pattern associated with data.

The circuits and methods also find particular application for circuits having multilevel outputs, such as in a PAM4 circuit, where two input signals are used to generate one of our four levels as an output signal. The eye diagram of FIG. 6 shows a PAM4 pattern associated with data. While the circuit of FIGS. 3 and 4 apply to NRZ signaling having two levels, it should be understood that the circuit of FIGS. 3 and 4 could be adapted for PAM4 signaling schemes as will be described in reference to FIGS. 7 and 8. As shown in FIG. 6, data signals are received according to a PAM4 protocol, where the received voltage of the signal may have a value of $-3h_0$, $-h_0$, $h_0$ or $3h_0$. According to the PAM4 protocol, a single value can be used to generate two bits of data, where $-3h_0$ may be represent 00, $-h_0$ may represent 01, $h_0$ may represent 10, and $3h_0$ may represent 11 for example. As will be described in reference to FIGS. 7 and 8, the circuits of 3 and 4 are duplicated to generate the appropriate voltages at the output.

In order to determine the appropriate value of a reference voltage to provide for a comparison with a detected value when implementing the PAM4 protocol, a level detection circuit determines in which of 4 possible ranges the detected voltage falls, and compares the detected value to a predetermined value associated with one of the four possible ranges. In particular, if a detected value of the input signal is determined to be greater than $+2h_0$, then the $+3h_0$ voltage value will be used as the reference value input to a error detector. If a detected value of the input signal is determined to be between 0 and $+2h_0$, then the $+h_0$ voltage value will be used as the reference value input to the error detector. If a detected value of the input signal is determined to be between 0 and $-2h_0$, then the $-h_0$ voltage value will be used as the reference value input to the error detector. Finally, if a detected value of the input signal is determined to be less than $-2h_0$, then the $-3h_0$ voltage value will be used as the reference value input to the error detector.

Figure 7:
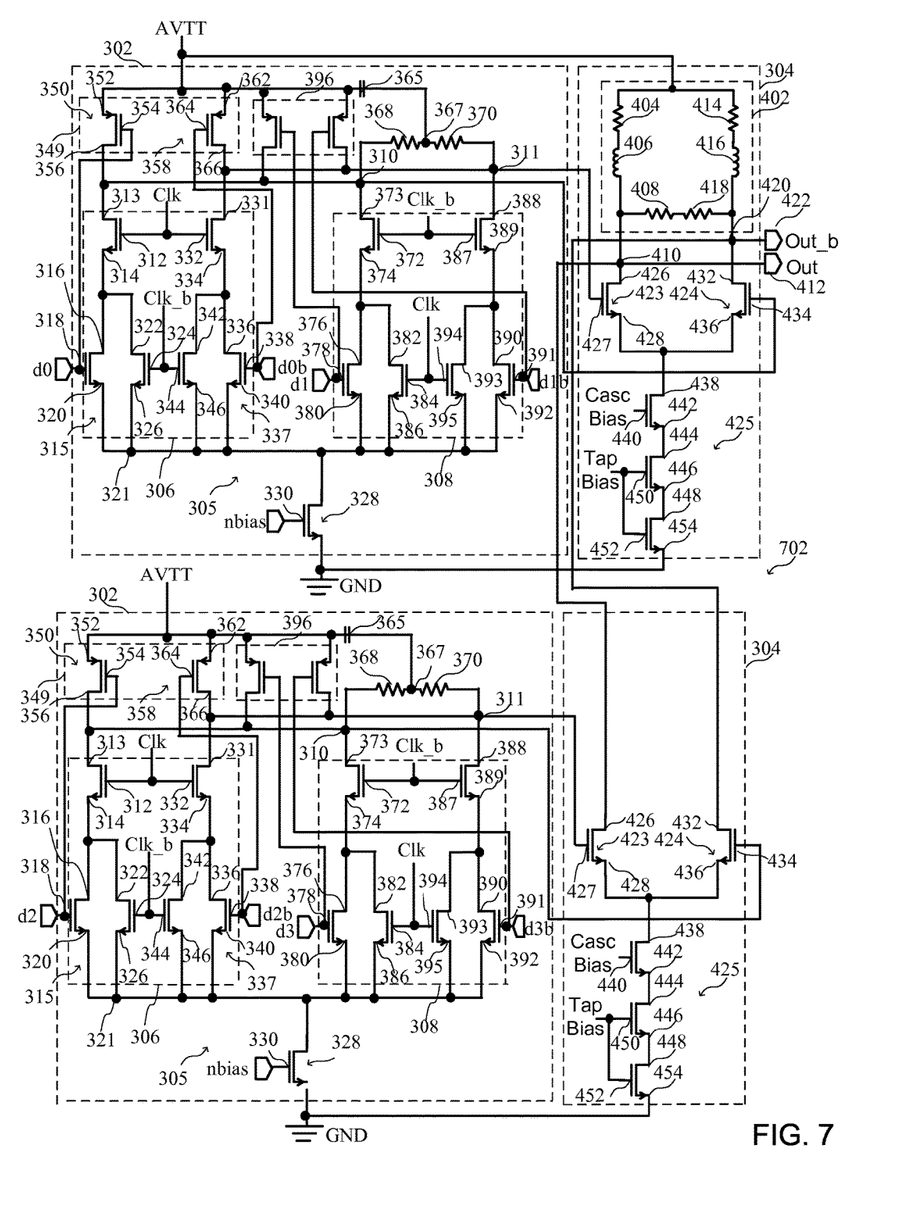
FIG. 7 is a block diagram of a circuit for generating a modulated signal in a transmitter of an integrated circuit for generating a PAM4 signal.
Figure 8:
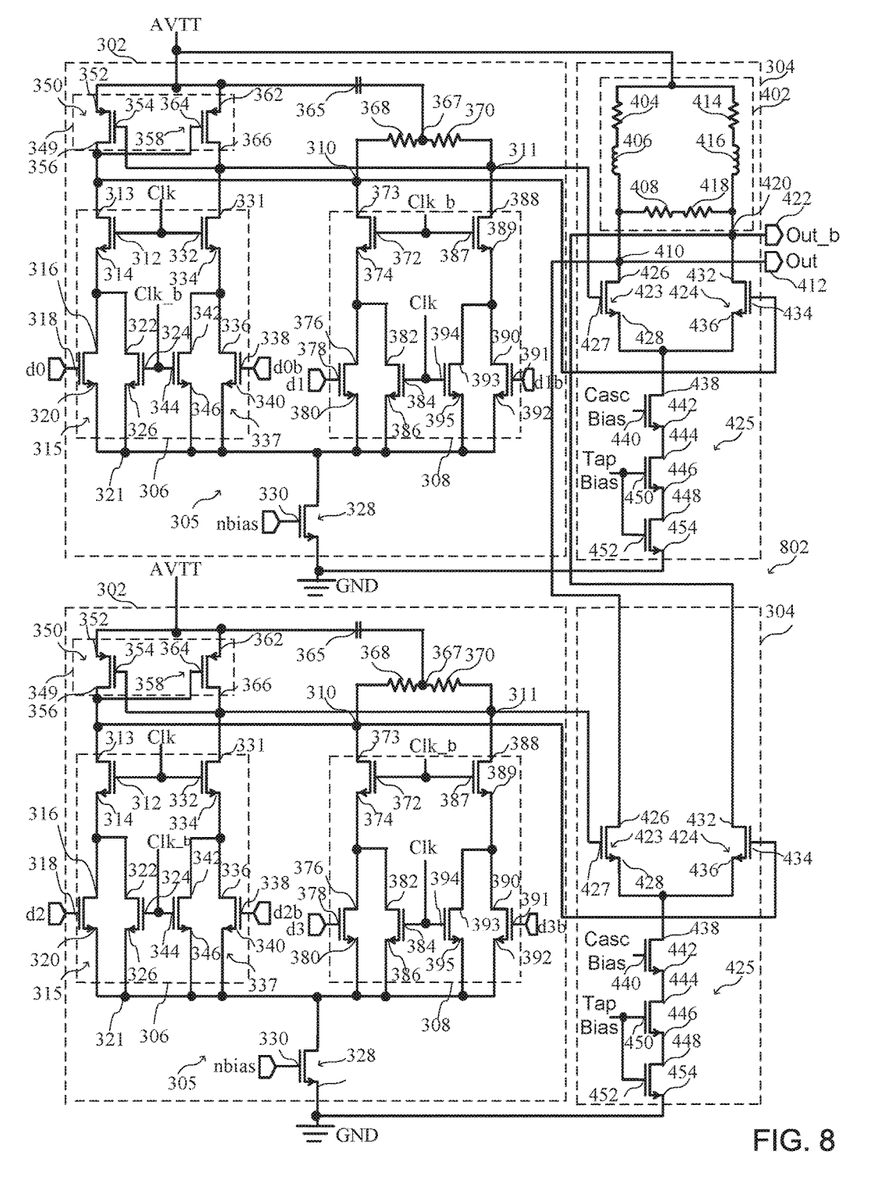
FIG. 8 is another block diagram of a circuit for generating a modulated signal in a transmitter of an integrated circuit for generating a PAM4 signal.

Turning now to FIG. 7, a block diagram of a circuit for generating a PAM4 signal in a transmitter of an integrated circuit is shown. The circuit of FIG. 7 includes the circuit of FIG. 3, having the integrated gain stage configured to provide a Pseudo H-cell with transistors 315 and 337, implemented again as circuit 702, where the output nodes 410 and 420 of the additional circuit 702 are each circuit are coupled to the output terminals 412 and 422, respectively. Based upon the two input data signals, (d0, d0b, d2, d20) when the clock signal is high (or the second pairs of input data d1, d1b, d3, d3b, when the inverted clock signal is high), the differential analog output signals Out and Out_b are generated at desired voltage levels to implement the PAM4 protocol as shown in FIG. 6. In the implementation of FIG. 8, the circuit of FIG. 4, having the integrated gain stage configured to implement a Pseudo H-cell with positive feedback, is implemented again as circuit 802, where the output nodes 410 and 420 of the circuit 802 are each circuit are coupled to the output terminals 412 and 422, respectively. Therefore, rather than implement a multiplexer and a pre-driver as two separate consecutive stages with a focus on multiplexing with high bandwidth but low swing, and then a recovery of high swing to provide a suitable input for driver, the circuits of FIGS. 3, 4, 7 and 8 provide a multiplexer having an integrated gain stage with improved performance. By eliminating a pre-driver and combining multiplexing and pre-driving functions, transmitter power is reduced and jitter performance is improved.

Figure 9:
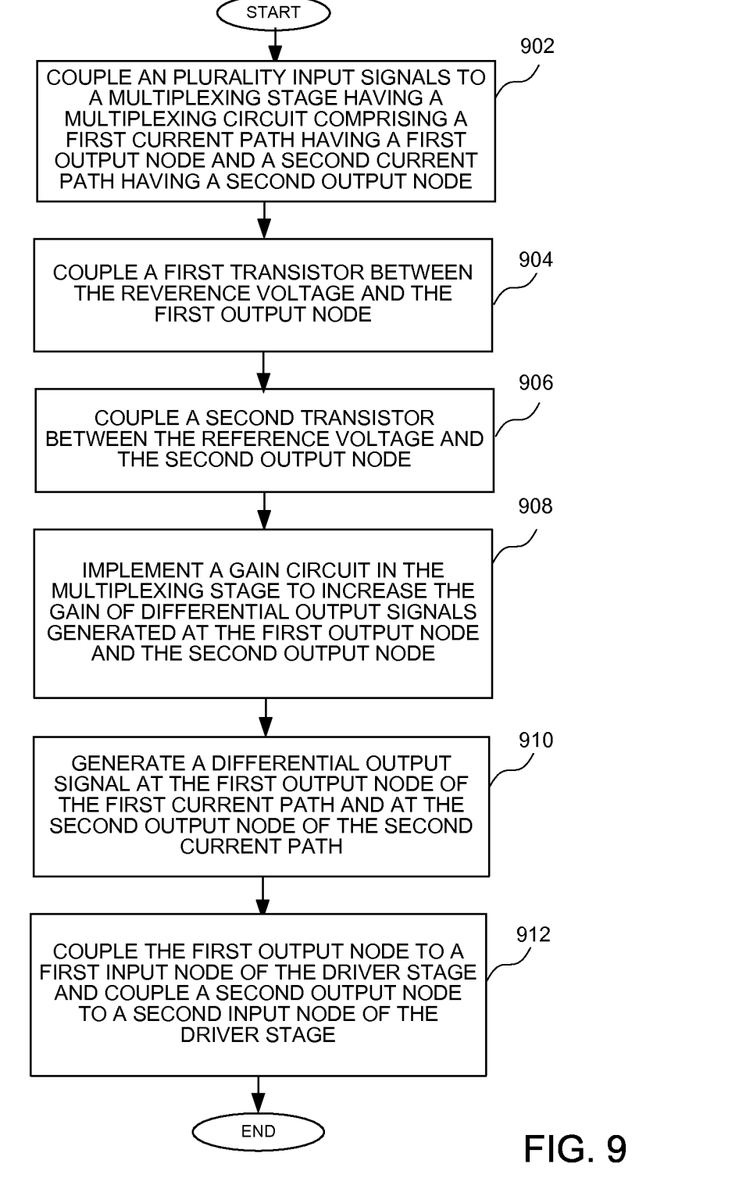
FIG. 9 is a flow chart showing a method of generating a modulated signal in a transmitter of an integrated circuit.

Turning now to FIG. 9, a flow chart shows a method of generating a modulated signal in a transmitter of an integrated circuit. In particular, a plurality of input signals are coupled to a multiplexing stage having a multiplexing circuit comprising a first current path and a second current path at a block 902. The first current path and the second current path could be associated with the first and second multiplexer portions 306 and 308 for example. A first transistor is coupled between the reference voltage and the first output node at a block 904. A second transistor is coupled between the reference voltage and the second output node at a block 906. The first and second transistors could be transistors 350 and 358 of the gain circuit 349, for example, and the multiplexing stages could be implemented according to the circuits of FIG. 3 or 4.

The gain circuit is implemented in the multiplexing stage to increase the swing of the differential output signal at the first output node and the second output node at a block 908. The gain circuit is integrated with the multiplexer circuit, and could be implemented as a Pseudo H-cell as shown in FIG. 3 or as a Pseudo H-cell with positive feedback as shown in FIG. 4. A differential output signal is generated at the first output node of the first current path and at the second output node of the second current path at a block 910. A first output signal of the differential output signal is coupled to a first input node of the driver stage, and a second output signal of the differential output signal is coupled to a second input node of the driver stage at a block 912. While the method of FIG. 9 relates to single multiplexing stage, the method could also be implemented with two multiplexing stages to implement a PAM4 protocol.

The various elements of the method of FIG. 9 may be implemented using the circuits of FIGS. 1-8 as described, or using some other suitable circuits. While specific elements of the method are described, it should be understood that additional elements of the method, or additional details related to the elements, could be implemented according to the disclosure of FIGS. 1-8.

It can therefore be appreciated that new circuits for and methods of generating a modulated signal in an integrated circuit has been described. It will be appreciated by those skilled in the art that numerous alternatives and equivalents will be seen to exist that incorporate the disclosed invention. As a result, the invention is not to be limited by the foregoing embodiments, but only by the following claims.

I claim:

1. A transmitter circuit for generating a modulated signal in a transmitter of an integrated circuit, the transmitter circuit comprising:
   a multiplexing stage having a multiplexing circuit configured to receive a differential input signal and to generate a differential output signal at a first output node of a first current path and at a second output node of a second current path, the multiplexing stage having a gain circuit configured to increase the swing of the differential output signal generated at the first output node and the second output node;
   wherein the multiplexing stage comprises:
   a first transistor having a source coupled to a reference voltage and having a drain coupled to the first output node;
   a second transistor having a drain coupled to the first output node and having a source coupled to a ground node;
   a third transistor having a source coupled to the reference voltage and having a drain coupled to the second output node; and
   a fourth transistor having a drain coupled to the second output node and having a source coupled to the ground node;

wherein a gate of the first transistor is coupled to a gate of the second transistor and a gate of the third transistor is coupled to a gate of the fourth transistor.

2. The transmitter circuit of claim 1, further comprising:
a fifth transistor having a drain coupled to the drain of the first transistor and having a source coupled to the drain of the second transistor; and
a sixth transistor having a drain coupled to the drain of the third transistor and having a source coupled to the drain of the fourth transistor, wherein a gate of the fifth transistor and a gate of the sixth transistor are configured to receive a clock signal.

3. A transmitter circuit for generating a modulated signal in a transmitter of an integrated circuit, the transmitter circuit comprising:
a multiplexing stage having a multiplexing circuit configured to receive a differential input signal and to generate a differential output signal at a first output node of a first current path and at a second output node of a second current path, the multiplexing stage having a gain circuit configured to increase the swing of the differential output signal generated at the first output node and the second output node;
wherein the multiplexing stage comprises:
a first transistor having a source coupled to a reference voltage and having a drain coupled to the first output node;
a second transistor having a drain coupled to the first output node and having a source coupled to a ground node;
a third transistor having a source coupled to the reference voltage and having a drain coupled to the second output node; and
a fourth transistor having a drain coupled to the second output node and having a source coupled to the ground node;
wherein a gate of the first transistor is coupled to the drain of the third transistor and wherein a gate of the third transistor is coupled to the drain of the first transistor.

4. The transmitter circuit of claim 3, further comprising:
a fifth transistor having a drain coupled to the drain of the first transistor and having a source coupled to the drain of the second transistor; and
a sixth transistor having a drain coupled to the drain of the third transistor and having a source coupled to the drain of the fourth transistor, wherein a gate of the fifth transistor and a gate of the sixth transistor are configured to receive a clock signal.

5. The transmitter circuit of claim 1 further comprising a transistor coupled to the first current path and the second current path, the transistor enabling the flow of current in the first current path and the second current path.

6. The transmitter circuit of claim 1, further comprising a first resistor and a second resistor coupled in series at a node, the transmitter circuit further comprising a capacitor coupled between the reference voltage and the node.

7. A transmitter circuit for generating a modulated signal in a transmitter of an integrated circuit, the transmitter circuit comprising:
a multiplexing stage having a multiplexing circuit configured to receive a differential input signal and to generate a differential output signal at a first output node of a first current path and at a second output node of a second current path, the multiplexing stage having a gain circuit configured to increase the swing of the differential output signal generated at the first output node and the second output node;
wherein the multiplexing circuit comprises:
a differential multiplexing circuit having a first multiplexer portion configured to receive the differential input signal and a clock signal, and the differential output signal is generated at the first output node and the second output node in response to the clock signal;
a second multiplexer portion configured to receive a second differential input signal of the multiplexing stage and an inverted clock signal, and the differential output signal is generated by the second multiplexer portion at the first output node and the second output node in response to the inverted clock signal; and
wherein the multiplexing stage further comprises a second gain circuit configured to increase the swing of the differential output signal generated by the second multiplexer portion at the first output node and the second output node.

8. The transmitter circuit of claim 7, wherein the first multiplexer portion comprises a first transistor and a second transistor configured to receive the differential input signal, a third transistor coupled in parallel with the first transistor and a fourth transistor coupled in parallel with the second transistor, wherein the second multiplexer portion comprises a fifth transistor and a sixth transistor configured to receive the second differential input signal, a seventh transistor coupled in parallel with the fifth transistor and an eighth transistor coupled in parallel with the sixth transistor, and wherein the clock signal is coupled to a gate of each of the seventh and eighth transistors.

9. The transmitter circuit of claim 1, further comprising a driver stage, wherein a first input of the driver stage is directly connected to the first output node of the multiplexing stage and a second input of the driver stage is directly connected to the second output node of the multiplexing stage.

10. The transmitter circuit of claim 1, wherein the gate of the first transistor is connected to the gate of the second transistor and wherein the gate of the third transistor is connected to the gate of the fourth transistor.

11. The transmitter circuit of claim 3, wherein the gate of the first transistor is connected to the drain of the third transistor and wherein the gate of the third transistor is connected to the drain of the first transistor.

12. The transmitter circuit of claim 7, further comprising a transistor coupled to the first current path and the second current path, the transistor enabling the flow of current in the first current path and the second current path.

13. The transmitter circuit of claim 7, further comprising a first resistor and a second resistor coupled in series at a node, the transmitter circuit further comprising a capacitor coupled between a reference voltage and the node.

14. The transmitter circuit of claim 7, further comprising a driver stage, wherein a first input of the driver stage is directly connected to the first output node of the multiplexing stage and a second input of the driver stage is directly connected to the second output node of the multiplexing stage.

15. The transmitter circuit of claim 3, further comprising a transistor coupled to the first current path and the second current path, the transistor enabling the flow of current in the first current path and the second current path.

16. The transmitter circuit of claim 3, further comprising a first resistor and a second resistor coupled in series at a node, the transmitter circuit further comprising a capacitor coupled between the reference voltage and the node.

17. The transmitter circuit of claim 3, further comprising a driver stage, wherein a first input of the driver stage is directly connected to the first output node of the multiplexing stage and a second input of the driver stage is directly connected to the second output node of the multiplexing stage.

* * * * *